US011264903B2

(12) United States Patent
Liu et al.

(10) Patent No.: US 11,264,903 B2
(45) Date of Patent: Mar. 1, 2022

(54) POWER CONVERTER WITH ZERO-VOLTAGE SWITCHING

(71) Applicant: TEXAS INSTRUMENTS INCORPORATED, Dallas, TX (US)

(72) Inventors: Pei-Hsin Liu, Westford, MA (US); James Michael Walden, Apex, NC (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 530 days.

(21) Appl. No.: 15/707,257

(22) Filed: Sep. 18, 2017

(65) Prior Publication Data

US 2019/0089250 A1    Mar. 21, 2019

(51) Int. Cl.
| | | |
|---|---|---|
| *H02M 3/158* | (2006.01) | |
| *H03K 17/284* | (2006.01) | |
| *H02M 3/335* | (2006.01) | |
| *H02M 1/36* | (2007.01) | |
| *H02M 1/08* | (2006.01) | |

(Continued)

(52) U.S. Cl.
CPC ........... *H02M 3/1582* (2013.01); *H02M 1/08* (2013.01); *H02M 1/36* (2013.01); *H02M 3/33546* (2013.01); *H02M 3/33569* (2013.01); *H03K 17/133* (2013.01); *H03K 17/284* (2013.01); *H02M 1/0025* (2021.05); *H02M 1/0058* (2021.05); *H02M 1/342* (2021.05)

(58) Field of Classification Search
CPC .. H02M 1/08; H02M 1/36; H02M 2001/0003; H02M 2001/0009; H02M 2001/0029; H02M 3/156; H02M 3/335; H02M 3/33538; H02M 3/33546; H02M 3/3353; H02M 3/33507; H02M 3/337; H02M 1/0025; H02M 1/0058; H02M 1/342; H02M 3/1582; H02M 3/33569; H03K 17/133; H03K 17/284
See application file for complete search history.

(56) References Cited

U.S. PATENT DOCUMENTS

2006/0055433 A1* 3/2006 Yang ................. H02M 3/33507
327/10
2010/0259951 A1* 10/2010 Adragna ............... H02M 3/337
363/17

(Continued)

*Primary Examiner* — Thienvu V Tran
*Assistant Examiner* — Shahzeb K Ahmad
(74) *Attorney, Agent, or Firm* — Mark Allen Valetti; Charles A. Brill; Frank D. Cimino (57) ABSTRACT

A power converter circuit includes a power stage that includes a transformer and a switch. The switch can be controlled in response to a PWM signal to provide a primary current through a primary winding of the transformer to induce a secondary current in a secondary winding of the transformer to generate an output voltage. The power stage includes a switching node between the switch and the primary winding having a switching voltage. The circuit also includes a switching controller configured to generate the PWM signal in response to a ramp signal. The ramp signal can have an amplitude of a slope that is proportional to a decay rate of a magnetizing current of the transformer and generated in response to feedback from the power stage. The switch can be activated in response to the switching voltage having an amplitude of approximately zero volts based on the amplitude of the ramp signal.

20 Claims, 6 Drawing Sheets

(51) Int. Cl.
*H03K 17/13* (2006.01)
*H02M 1/00* (2006.01)
*H02M 1/34* (2007.01)

(56) References Cited

U.S. PATENT DOCUMENTS

| | | | |
|---|---|---|---|
| 2012/0170324 A1* | 7/2012 | Fornage | H02M 3/337 363/17 |
| 2015/0256084 A1* | 9/2015 | Liu | H02M 3/33507 363/17 |
| 2016/0329821 A1* | 11/2016 | Zhang | H02M 3/33523 |
| 2016/0344293 A1* | 11/2016 | Hari | H02M 3/33507 |
| 2017/0117814 A1* | 4/2017 | Adragna | H02M 1/08 |
| 2017/0288554 A1* | 10/2017 | Fahlenkamp | H02M 1/08 |
| 2018/0301975 A1* | 10/2018 | Lin | H02M 1/083 |

* cited by examiner

POWER CONVERTER WITH ZERO-VOLTAGE SWITCHING

TECHNICAL FIELD

This disclosure relates generally to electronic systems, and more specifically to a power converter with zero-voltage switching.

BACKGROUND

Power converter circuits can be implemented in a variety of different ways. One such example is a synchronous rectifier power converter. Synchronous rectification is a technique for improving the efficiency of rectification in power supplies by replacing diodes with actively controlled switches such as transistors (e.g., power MOSFETs). The constant voltage drop of a standard p-n junction diode often used for power supply rectification is typically between 0.7 V and 1.7 V causing significant power loss in the diode. One example approach to mitigate such power loss replaces standard silicon diodes with Schottky diodes, which exhibit lower voltage drops (e.g., as low as 0.3 volts). However, even Schottky rectifiers can be significantly more lossy than the synchronous type at high current values and low voltages.

When addressing low-voltage converters, such as a buck converter power supply for a computer (with a voltage output of five volts or less, and many amperes of output current), Schottky rectification does not provide adequate efficiency. In such applications, synchronous rectification is more appropriate. Replacing the diode with an actively controlled switching element, such as a MOSFET, is the main factor of synchronous rectification. The MOSFETs have a constant very low resistance when conducting, referred to as on-resistance ($R_{DS}$(on)). They can be made with an on-resistance as low as ten mΩ or even lower. The voltage drop across the transistor device is much lower versus a diode rectifier, meaning a reduction in power loss and a gain in efficiency.

The control circuitry for synchronous rectification often uses comparators to sense the voltage of the input AC voltage and activates the transistors at the correct times to provide current flow in the desired direction to produce DC voltages. The timing of switching can subject the power converter to power losses. As an example, the power converter can be subject to clamping losses based on diode-rectification and/or switching losses based on rectification with transistors (e.g., MOSFETs). Such losses provide for less efficiency in operation of the respective power converter.

SUMMARY

A power converter circuit includes a power stage that includes a transformer and a switch. The switch can be controlled in response to a PWM signal to provide a primary current through a primary winding of the transformer to induce a secondary current in a secondary winding of the transformer to generate an output voltage. The power stage includes a switching node between the switch and the primary winding having a switching voltage. The circuit also includes a switching controller configured to generate the PWM signal in response to a ramp signal. The ramp signal can have an amplitude that has a slope that is proportional to a decay rate of a magnetizing current of the transformer and generated in response to feedback from the power stage. The switch can be activated in response to the switching voltage having an amplitude of approximately zero volts based on the amplitude of the ramp signal.

Another example includes a power converter circuit. The circuit includes a power stage comprising a transformer, a first switch, and a second switch. The first switch can be controlled via a first PWM signal to provide a primary current through a primary winding of the transformer to induce a secondary current in a secondary winding of the transformer to generate an output voltage and the second switch being controlled via a second PWM signal to re-circulate a magnetizing current associated with the transformer via an LC resonator formed by the primary winding and a capacitor. The circuit also includes a switching controller configured to generate the first PWM signal and the second PWM signal and to generate a ramp signal in response to feedback from the power stage such that the slope of the ramp signal is proportional to a decay rate of the magnetizing current to provide zero-volt switching (ZVS) activation of the first switch via the first PWM signal.

Another example includes a power converter circuit. The circuit includes a gate driver stage configured to generate a first switching signal in response to a first PWM signal and a second switching signal in response to a second PWM signal. The circuit also includes a power stage comprising a transformer, a first switch, and a second switch. The first switch can be controlled via the first switching signal to provide a primary current through a primary winding of the transformer to induce a secondary current in a secondary winding of the transformer to generate an output voltage and induce an auxiliary voltage in an auxiliary winding of the transformer. The second switch can be controlled via the second switching signal to re-circulate a magnetizing current associated with the transformer via an LC resonator formed by the primary winding and a capacitor. The circuit also includes a switching controller configured to generate the first and second PWM signals and to generate a ramp signal based on the auxiliary voltage, the slope of the ramp signal being proportional to a decay rate of the magnetizing current to provide ZVS activation of the first switch via the first PWM signal.

DETAILED DESCRIPTION

This disclosure relates generally to electronic systems, and more specifically to a power converter with zero-voltage switching. The power converter can be implemented to generate an output voltage in response to an input voltage. As an example, the power converter can be configured as a flyback power converter. The power converter includes a gate driver stage that is configured to generate one or more switching signals in response to a respective at least one pulse-width modulation (PWM) signal. As an example, the gate driver can generate a first switching signal in response to a first PWM signal and a second switching signal in response to a second PWM signal. The power converter can also include a power stage. The power stage includes a transformer and at least one switch (e.g., transistor device) controlled by the switching signal(s) (e.g., a first switch and a second switch). As an example, the first switch can be activated via the first switching signal to provide a primary current through a primary winding of the transformer, from an input voltage to a low voltage rail (e.g., ground). The primary current can induce a secondary current in a secondary winding in an output stage to generate an output voltage (e.g., via a rectifier). The second switch can be activated via the second switching signal to circulate a magnetizing current associated with the transformer in a circuit path that includes an LC resonator.

In addition, the power converter includes a switching controller that is configured to generate the PWM signal(s) based on feedback from the power stage. As an example, the switching controller includes a magnetizing ramp generator that is configured to generate a ramp signal that has a positive slope that is proportional to a decay rate of the magnetizing current during a deactivated state of the switch (e.g., during activation of the second switch). The ramp signal can be compared with a ramp threshold, such as generated by a zero-volt switching (ZVS) optimizer, that corresponds with a negative peak amplitude of the magnetizing current that is sufficient to dissipate a capacitive charge in a switching node associated with the switch (e.g., the first switch). As a result, in response to the ramp signal having an amplitude that is approximately equal to the ramp threshold, the switching controller can deactivate the second switch and activate the first switch to effect an approximate zero-volt switching of the first switch. As a result, the power converter can substantially eliminate switching losses, and can provide for an efficient switching operation in generating the output voltage.

Figure 1:
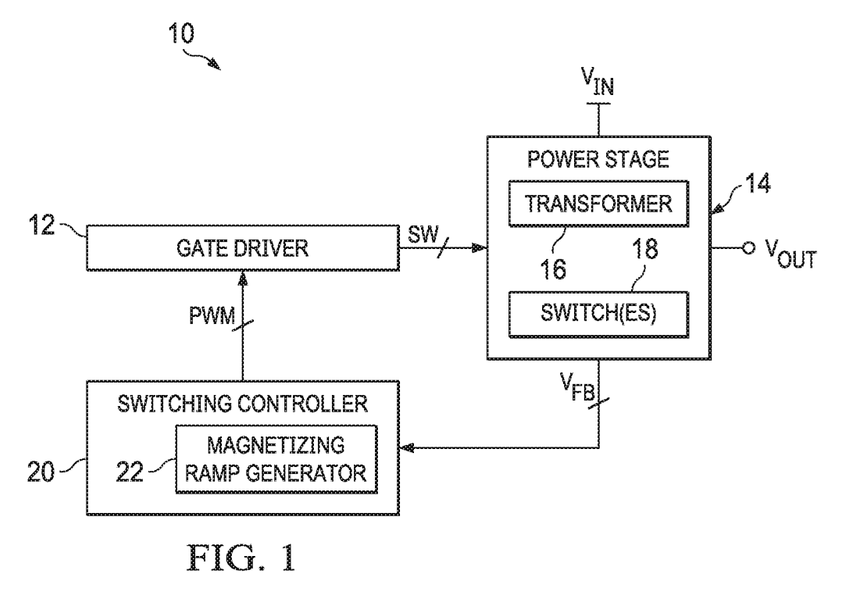
FIG. 1 illustrates an example of a power converter system.

FIG. 1 illustrates an example of a power converter system 10. The power converter system 10 is configured to convert an input voltage $V_{IN}$ (e.g., a DC input voltage) to a DC output voltage $V_{OUT}$. As an example, the power converter system 10 can be configured as a flyback power converter, as described in greater detail herein. The power converter system 10 can be implemented in any of a variety of electronic applications, such as in a portable electronic device, to provide efficient power conversion in generating the output voltage $V_{OUT}$.

The power converter system 10 includes a gate driver 12 that is configured to generate at least one switching signal SW based on a respective at least one pulse-width modulation (PWM) signal PWM (hereinafter "signal PWM"). The switching signal(s) SW are provided to a power stage 14. In the example of FIG. 1, the power stage 14 includes a transformer 16 and at least one switch 18 that is controlled by the switching signal(s) SW. As an example, one of the switch(es) 18 can be activated via a respective switching signal SW to provide a primary current through a primary winding of the transformer 16. The primary current can induce a secondary current in a secondary winding of the transformer 16 to generate the output voltage $V_{OUT}$ (e.g., via a rectifier). As an example, the switch(es) 18 can include a second switch that can be activated via a respective second switching signal SW to circulate a magnetizing current associated with the transformer 16, such as via an LC resonator.

The power converter system 10 further includes a switching controller 20 that is configured to generate the signal(s) PWM that are provided to the gate driver 12. The switching controller 20 includes a magnetizing ramp generator (hereinafter "ramp generator") 22 that is configured to generate a ramp signal that is implemented for the control of the signal(s) PWM, and therefore the control of the switch(es) 18 via the switching signal(s) SW. In the example of FIG. 1, the switching controller 20 is configured to generate the signal(s) PWM based on at least one feedback voltage $V_{FB}$. As an example, the feedback voltage(s) $V_{FB}$ can be associated with one or more voltages that characterize the performance of the power stage 14, such as including characterizing magnetizing current in the transformer. As described herein, the ramp signal can be generated as having a positive slope that is proportional to a decay rate of a magnetizing current associated with the transformer 16 to implement zero-volt switching (ZVS) of one of the switch(es) 18 to substantially mitigate switching losses associated with the power converter system 10. As a result, the power converter system 10 can operate in a significantly efficient manner.

Figure 2:
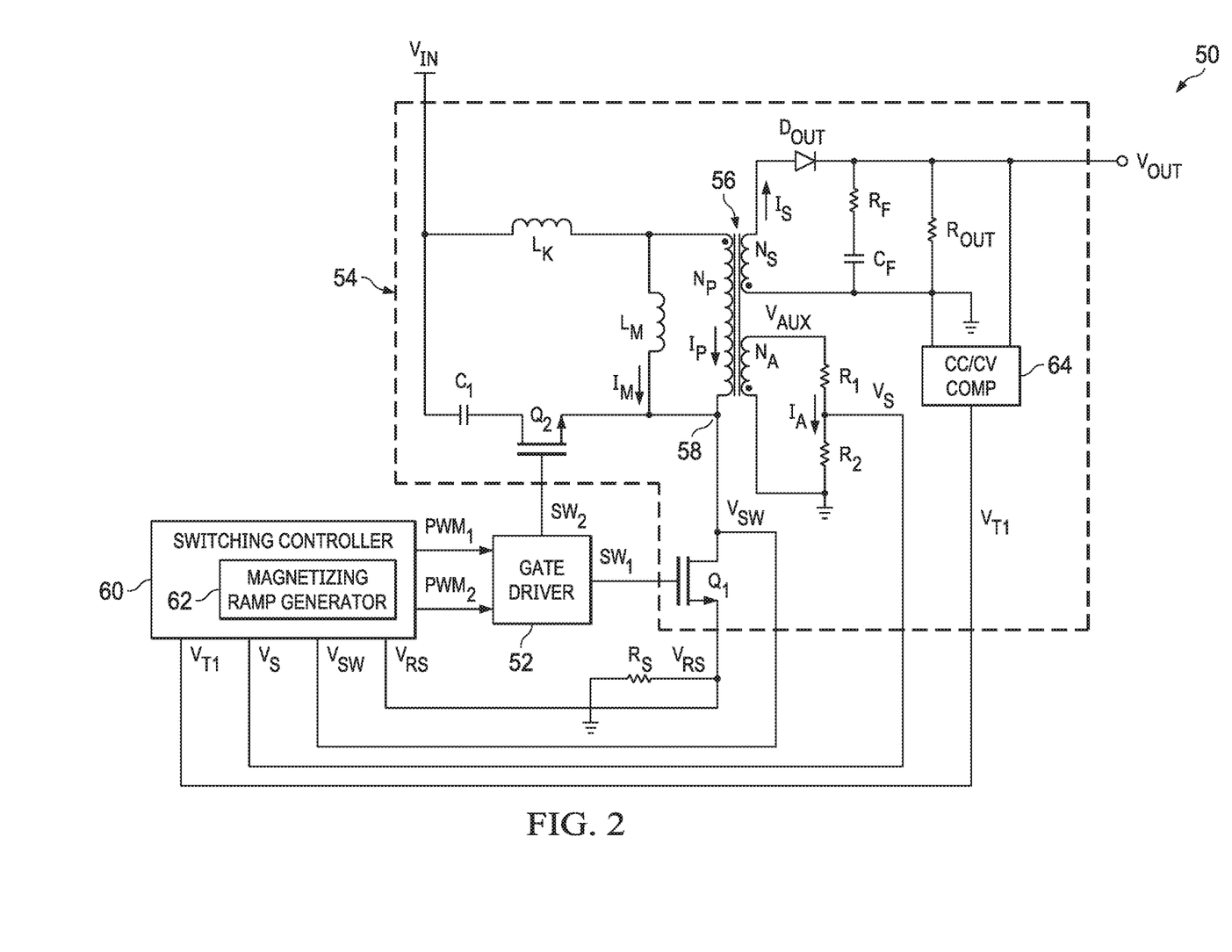
FIG. 2 illustrates an example of a power converter circuit.

FIG. 2 illustrates an example of a power converter circuit 50. The power converter circuit 50 is configured to convert a DC input voltage $V_{IN}$ to a DC output voltage $V_{OUT}$. The power converter circuit 50 can be implemented in any of a variety of electronic applications, such as in a portable electronic device, to provide efficient power conversion in generating the output voltage $V_{OUT}$.

The power converter circuit 50 includes a gate driver 52 that is configured to generate a first switching signal $SW_1$ and a second switching signal $SW_2$ based on respective signals $PWM_1$ and $PWM_2$. The power converter circuit 50 also includes a power stage 54. The power stage 54 includes a transformer 56 having a primary winding $N_P$, a secondary winding $N_S$, and an auxiliary winding $N_A$, as well as a magnetizing inductor $L_M$ that corresponds to the magnetic energy associated with the transformer 56. The power stage 54 also includes an input inductor $L_K$ corresponding to a leakage inductance of the transformer 56, a resonant capacitor $C_1$, and a pair of switches demonstrated in the example of FIG. 2 as a first N-channel field effect transistor device ("N-FET") $Q_1$ and a second N-FET $Q_2$. The N-FET $Q_1$ is controlled via the switching signal $SW_1$ and the N-FET $Q_2$ is controlled via the switching signal $SW_2$. The N-FETs $Q_1$ and $Q_2$ are coupled via a switching node 58.

During a first switching phase, the N-FET $Q_1$ is activated (e.g., with a gate-source voltage sufficient for saturation mode) via the first switching signal $SW_1$ to conduct a primary current $I_P$ from the input voltage $V_{IN}$ through the input inductor $L_K$, through the primary winding $N_P$, and through the N-FET $Q_1$ to a low-voltage rail (e.g., ground). In response, the primary current $I_P$ in the primary winding $N_P$ induces a secondary current $I_S$ in the secondary winding $N_S$ through an output diode $D_{OUT}$ to generate the output voltage $V_{OUT}$ across a load, demonstrated by a resistor $R_{OUT}$, and an output filter formed by a capacitor $C_F$ and a corresponding internal resistance $R_F$. Upon deactivation of the N-FET $Q_1$ via the first switching signal $SW_1$, during a second switching phase, the N-FET $Q_2$ is activated via the second switching signal $SW_2$ (e.g., after expiration of a predetermined dead-time) to decay a magnetizing current $I_M$ in a reverse direction by the voltage of the resonant capacitor $C_1$, such that the negative magnetizing current ($I_{M-}$) discharges the junction capacitance of the N-FET $Q_1$ and charges the junction capacitance of the N-FET $Q_2$. As the charge of the N-FET $Q_1$ is removed, the drain-to-source voltage of the N-FET $Q_1$ reduces to zero volts before activating the N-FET $SW_1$. As a result, the power converter circuit 50 can operate to efficiently reduce switching losses. During the activation time of the N-FET $Q_2$, the leakage inductance $L_K$ and the capacitor $C_1$ forms a resonant tank to circulate the leakage inductance $L_K$ energy to the output, such that clamping losses can also be efficiently reduced.

The power converter circuit 50 further includes a switching controller 60 that is configured to generate the first signal $PWM_1$ and the second signal $PWM_2$ that are provided to the gate driver 52. In the example of FIG. 2, the switching controller 60 includes a magnetizing ramp generator (hereinafter "ramp generator") 62 that is configured to generate a ramp signal that is implemented for the control of the signals $PWM_1$ and $PWM_2$, and therefore the control of the N-FETs $Q_1$ and $Q_2$ via the switching signals $SW_1$ and $SW_2$, respectively. The switching controller 60 is demonstrated as receiving a voltage $V_S$, a voltage $V_{T1}$, a voltage $V_{SW}$, and a voltage $V_{RS}$ that can collectively correspond to the feedback voltage(s) $V_{FB}$ in the example of FIG. 1. The switching controller 60 is thus configured to generate the signals $PWM_1$ and $PWM_2$ in response to the voltages $V_S$, $V_{T1}$, $V_{SW}$, and $V_{RS}$.

The voltage $V_{T1}$ is generated by a constant current/constant voltage compensation system ("CC/CV COMP") 64 that is configured to provide the voltage $V_{T1}$ as a threshold voltage to limit the magnitude of a positive peak magnetizing current ($I_{M+}$), so a substantially constant output current $I_{OUT}$ or output voltage $V_{OUT}$ can be regulated. The voltage $V_S$ can correspond to a voltage-divided auxiliary current $V_{AUX}$ associated with the auxiliary winding $N_A$, based on the voltage-divider formed by resistors $R_1$ and $R_2$ in series with the auxiliary winding $N_A$. The voltage $V_{RS}$ corresponds to a measure of amplitude of the peak magnetizing current $I_{M+}$ across a sense resistor $R_S$. The switching voltage $V_{SW}$ corresponds to a switching node voltage associated with the N-FET $Q_1$.

As described herein, the power converter circuit 50 is configured to implement zero-volt switching of the N-FET $Q_1$, and thus to activate the N-FET $Q_1$ at approximately zero volts amplitude of the switching voltage $V_{SW}$ at the switching node 58. As an example, to implement zero-volt switching, the power converter circuit 50 can implement the following criterion:

$$\tfrac{1}{2} * L_M * I_M(-)^2 \geq \tfrac{1}{2} * C_{SW} * V_{SW}^2 \qquad \text{Equation 1}$$

Where: $I_{M(-)}$ corresponds to the negative peak amplitude of the magnetizing current $I_M$;
$C_{SW}$ corresponds to the capacitance of the switching node 58.

$$I_M(-) = \left( K_O * \sqrt{\frac{C_{SW}}{L_M}} \right) * (V_{IN} + (N_P/N_S) * V_{OUT}) \qquad \text{Equation 2}$$

Where: $L_M$ corresponds to the magnetizing inductance (of the magnetizing inductor $L_M$);
$N_P/N_S$ is a turns ratio between the secondary winding $N_S$ and the primary winding $N_P$;
$K_O$ corresponds to a gain constant greater than or equal to one.

For example, as described in greater detail herein, the switching controller 60 can generate the ramp signal as having a positive slope that is proportional to a decay rate of a magnetizing current $I_M$ to implement zero-volt switching (ZVS) of the N-FET $Q_1$ to substantially mitigate switching losses associated with the power converter system 50. As a result, the power converter system 50 can operate in a significantly efficient manner based on having significantly mitigated switching losses and clamping losses.

Figure 3:
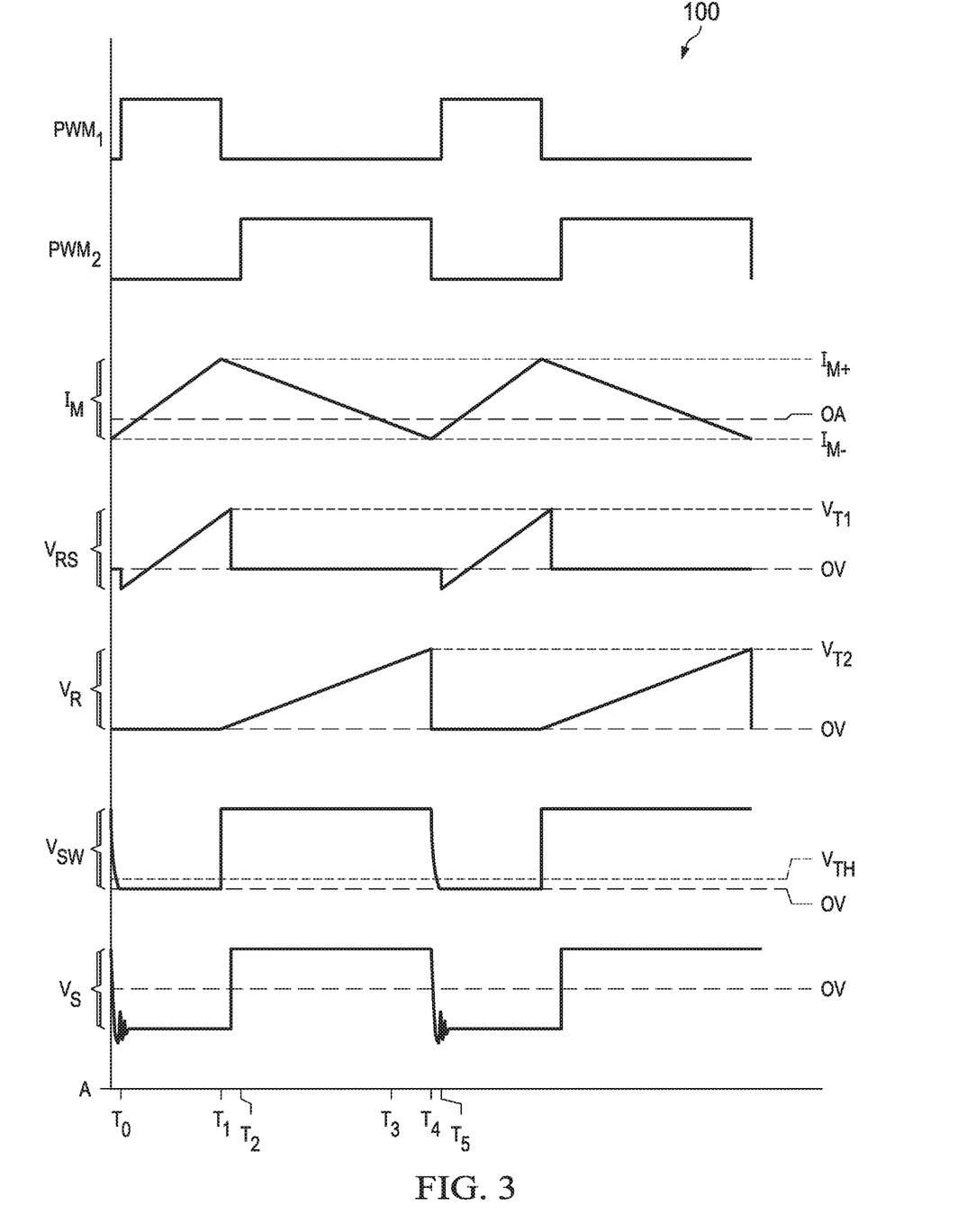
FIG. 3 illustrates an example of a timing diagram.

FIG. 3 illustrates an example of a timing diagram 100. The timing diagram 100 demonstrates signals demonstrated in the example of FIG. 2 plotted as a function of time. Thus, reference is to be made to the example of FIG. 2 in the following description of the example of FIG. 3.

The timing diagram 100 demonstrates the first signal $PWM_1$, the second signal $PWM_2$, the magnetizing current $I_M$, the voltage $V_{RS}$, a voltage $V_R$ corresponding to the ramp signal generated by the magnetizing ramp generator 62, the switching voltage $V_{SW}$, and the voltage $V_S$ plotted over time. At approximately a time $T_0$, the signal $PWM_1$ is asserted from a logic-low to a logic-high state. As described herein, the signal $PWM_1$ can be asserted in response to the switching voltage decreasing less than a threshold voltage $V_{TH}$. Thus, in response to the switching voltage $V_{SW}$ decreasing less than the threshold voltage $V_{TH}$ at approximately the time $T_0$, the signal $PWM_1$ can be asserted. Accordingly, the switching signal $SW_1$ can likewise be asserted via the gate driver 52 in response to the signal $PWM_1$ to activate the N-FET $Q_1$ at approximately the time $T_0$.

Prior to the time $T_0$, the magnetizing current $I_M$ can be negative (e.g., with respect to the direction of the current flow of the magnetizing current $I_M$ in the example of FIG. 2). In response to activation of the N-FET $Q_1$, a current path is formed for the primary current $I_P$ between the input voltage $V_{IN}$ and the low-voltage rail (e.g., ground) via the leakage inductance $L_K$, the primary winding $N_P$, the activated N-FET $Q_1$, and the sense resistor $R_S$. In response, the primary current Ip initially has a negative amplitude (e.g., with respect to the direction of the current flow of the primary current $I_P$ in the example of FIG. 2), but begins to reverse direction (e.g., becomes less negative) to eventually become positive to flow from the input voltage $V_{IN}$ to the low-voltage rail. In the example of FIG. 3, the primary current $I_P$ is represented by the voltage $V_{RS}$ as having an amplitude that is equal to the primary current $I_P$ multiplied by the sense resistance $R_S$. Thus, subsequent to the time $T_0$, the voltage $V_{RS}$ is demonstrated as increasing linearly. Similarly, the magnetizing current $I_M$ can likewise increase linearly. Additionally, during activation of the N-FET $Q_1$, the switching voltage $V_{SW}$ can have an amplitude of approximately zero volts, and the voltage $V_S$ can have a negative amplitude (e.g., approximately proportional to a negative turns ratio between the primary winding $N_P$ and the auxiliary winding $N_A$ times the input voltage $V_{IN}$).

As described in greater detail herein, the switching controller 60 can be configured to compare the voltage $V_{RS}$ with the voltage $V_{T1}$, such as provided from the CC/CV compensation system 64. In response to the voltage $V_{RS}$ increasing to an amplitude that is approximately equal to (e.g., just greater than) the voltage $V_{T1}$, at approximately a time $T_1$, the switching controller 60 can be configured to de-assert the signal $PWM_1$ to deactivate the N-FET $Q_1$ via the first switching signal $SW_1$. Thus, at approximately the time $T_1$, the primary current $I_P$ can have an amplitude that is sufficient for the secondary current $I_S$ to maintain the substantially constant amplitude of the output voltage $V_{OUT}$ and/or substantially constant amplitude of the output current IOUT. In response to deactivation of the N-FET $Q_1$, the magnetizing current $I_M$ can begin to decrease linearly from a maximum amplitude of $I_{M+}$, and the voltage $V_{RS}$ can substantially immediately decrease to approximately zero volts. Additionally, the switching voltage $V_{SW}$ can substantially immediately increase to a maximum amplitude, and the voltage $V_S$ can likewise immediately increase to a maximum amplitude (e.g., approximately proportional to the turns ratio between the secondary winding $N_S$ and the auxiliary winding $N_A$ times the output voltage $V_{OUT}$). Furthermore, the ramp signal $V_R$, generated by the ramp generator 62, can begin to increase linearly at an increment rate that is proportional to the rate of decay (decrease) of the magnetizing current $I_M$.

At approximately a time $T_2$, the switching controller 60 can be configured to assert the signal $PWM_2$. For example, the switching controller 60 can provide subsequent assertion of the signal $PWM_2$ after de-assertion of the signal $PWM_1$ based on a predetermined dead-time to prevent shoot-through of current through concurrently activated N-FETs $Q_1$ and $Q_2$. At a time $T_3$, the decreasing magnetizing current $I_M$ can reverse direction by demagnetizing the magnetizing inductance $L_M$ with the voltage of resonant capacitor $C_1$. As a result, the negative magnetizing current $I_M$ can operate to discharge the stored capacitance in the switching node 58. As an example, the switching node 58 can have parasitic capacitance associated with the primary inductor $N_P$, the N-FET $Q_1$, the N-FET $Q_2$ and/or other sources of parasitic capacitance. As described in greater detail herein, by discharging the stored capacitance in the switching node, the N-FET $Q_1$ can be subsequently activated in a ZVS manner.

Subsequent to the time $T_3$, as described in greater detail herein, the switching controller 60 can be configured to compare the ramp signal $V_R$ with the voltage $V_{T2}$. As an example, as described in greater detail herein, the voltage $V_{T2}$ can be generated as a difference voltage that is added to the voltage $V_{T1}$, and can be tunable after startup of the power converter circuit 50, such as based on changing operational conditions of the power converter circuit 50. In response to the ramp signal $V_R$ increasing to an amplitude that is approximately equal to (e.g., just greater than) the voltage $V_{T2}$, at approximately a time $T_4$, the switching controller 60 can be configured to de-assert the signal $PWM_2$ to deactivate the N-FET $Q_2$ via the second switching signal $SW_2$. At approximately the time $T_4$, the magnetizing current $I_M$ has a negative peak amplitude equal to approximately $I_{M-}$ (e.g., as defined by Equation 2 previously) that can correspond to an amplitude that is approximately sufficient to substantially discharge the capacitance of the switching node 58.

In response to deactivation of the N-FET $Q_2$, the magnetizing inductor $L_M$ can switch polarity, causing the magnetizing current $I_M$ to begin to increase (e.g., become less negative) linearly. In addition, the voltage $V_S$ can likewise decrease rapidly at approximately the time $T_4$, and can ring slightly before settling to the negative amplitude. Similarly, in response to the deactivation of the N-FET $Q_2$, the switching voltage $V_{SW}$ can begin to decrease rapidly. Upon decrease of the switching voltage $V_{SW}$ to less than the threshold voltage $V_{TH}$ at approximately a time $T_5$, the switching controller 60 can assert the signal $PWM_1$, similar to as described previously at approximately the time $T_0$. Accordingly, the power converter circuit 50 can repeat the control of the respective signals $PWM_1$ and $PWM_2$ with respect to assertion and de-assertion, and thus the activation and deactivation of the respective N-FETs $Q_1$ and $Q_2$.

Figure 4:
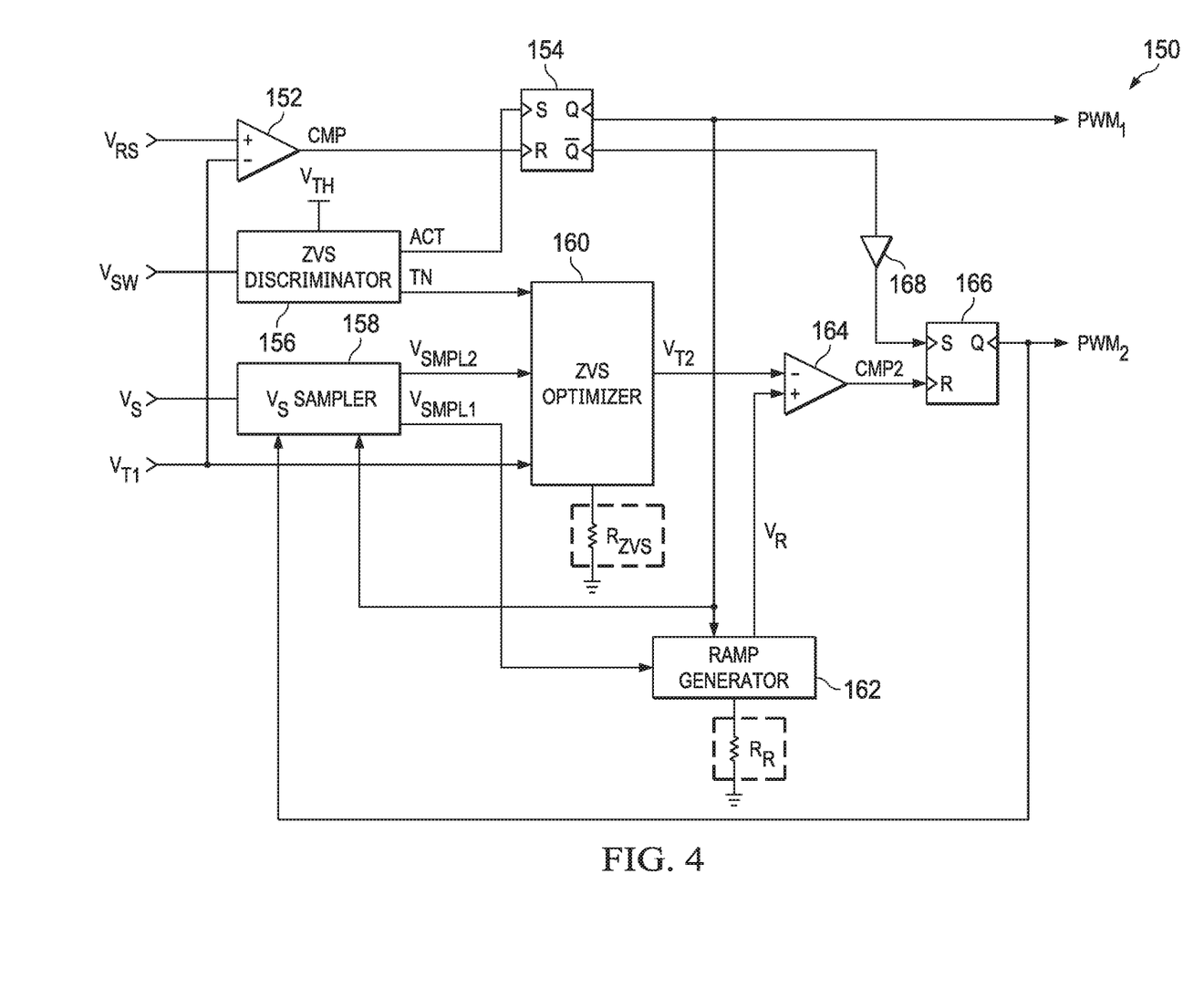
FIG. 4 illustrates an example of a switching controller.

FIG. 4 illustrates an example of a switching controller 150. The switching controller 150 can correspond to the switching controller 60 in the example of FIG. 2. Therefore, reference is to be made to the example of FIGS. 2 and 3 in the following description of the example of FIG. 4.

The switching controller 150 is configured to receive, as inputs, the voltage $V_{RS}$, the switching voltage $V_{SW}$, the voltage $V_S$, and the voltage $V_{T1}$. The switching controller 150 includes a comparator 152 that is configured to compare the voltage $V_S$ and the voltage $V_{T1}$. In the example of FIG. 4, the comparator 152 receives the voltage $V_{RS}$ at a non-inverting input, and the voltage $V_{T1}$ at an inverting input. The comparator 152 thus provides a first comparison signal CMP1 that is logic-high in response to the voltage $V_{RS}$ increasing greater than the voltage $V_{T1}$, such as demonstrated at approximately the time $T_1$ in the example of FIG. 3. The first comparison signal CMP1 is provided to a reset input of an SR latch 154 to thus de-assert the signal $PWM_1$, provided from the Q output of the SR latch 154. The switching controller 150 also includes a ZVS discriminator 156 that is configured to generate an activation signal ACT in response to the switching voltage $V_{SW}$ and based on the threshold voltage $V_{TH}$. For example, in response to the switching voltage $V_{SW}$ decreasing less than the threshold voltage $V_{TH}$, such as demonstrated at approximately the times $T_0$ and $T_5$ in the example of FIG. 3, the ZVS discriminator 156 can assert the activation signal ACT that is provided to the set input of the SR latch 154 to assert the signal $PWM_1$. In addition, as described in additional detail herein, the ZVS discriminator 156 can generate a tuning signal TN, such as based on detecting a non-zero switching condition associated with the switching of the N-FET $Q_1$.

The switching controller 150 also includes a $V_S$ sampler circuit 158 that is configured to generate sample voltages associated with the voltage $V_S$. As an example, the voltage $V_S$ can be sampled by the respective signals $PWM_1$ and $PWM_2$. For example, the voltage $V_S$ can be sampled at each of the substantially stable amplitudes of the voltage $V_S$, such as after stabilization, by the respective signals $PWM_1$ and $PWM_2$. Thus, the $V_S$ sampler circuit 158 can provide a first sampled voltage $V_{SMPL1}$ and a second sampled voltage $V_{SMPL2}$. For example, the first sampled voltage $V_{SMPL1}$ can be associated with the voltage $V_S$ being sampled at a substantially maximum amplitude (e.g., positive plateau) via the signal $PWM_1$, and the second sampled voltage $V_{SMPL2}$ can be associated with the voltage $V_S$ being sampled at a substantially minimum amplitude (e.g., negative plateau) via the signal $PWM_1$.

The second sampled voltage $V_{SMPL2}$ is provided to a ZVS optimizer 160 that is configured to generate the voltage $V_{T2}$. As an example, the ZVS optimizer 160 can include a transconductance amplifier that is configured to generate the voltage $V_{T2}$ based on the second sampled voltage $V_{SMPL2}$ and based on the voltage $V_{T1}$. For example, the ZVS optimizer 160 can be circuitry configured to generate a difference voltage that is added to the voltage $V_{T1}$ to provide the voltage $V_{T2}$. Additionally, the ZVS optimizer 160 is provided the tuning signal TN that is configured to adjust an amplitude of the voltage $V_{T2}$, such as in response to detection of a non-zero voltage switching condition of the N-FET $Q_1$. Furthermore, the ZVS optimizer 160 is demonstrated in the example of FIG. 4 as being tuned by an externally provided resistor $R_{ZVS}$. As an example, the externally provided resistor $R_{ZVS}$ can be coupled to the IC package (e.g., via one or more pins) by a respective customer to set a transconductance of the associated transconductance amplifier to tune the amplitude of the voltage $V_{T2}$. Accordingly, the voltage $V_{T2}$ can be associated with a zero-voltage switching condition of the N-FET $Q_1$ with respect to the ramp signal $V_R$, as described herein.

The first sampled voltage $V_{SMPL1}$ is provided to a ramp generator 162 that is configured to generate the ramp signal (e.g., ramp voltage) $V_R$. As an example, the ramp generator 162 can include a transconductance amplifier that is configured to generate the ramp signal $V_R$ based on the first sampled voltage $V_{SMPL1}$ and based on the signal $PWM_2$. For example, the positive slope of the ramp signal $V_R$ can be proportional to a rate of decay of the magnetizing current $I_M$, such that the ramp signal $V_R$ can be indicative of the slope of the magnetizing current $I_M$. Furthermore, the ramp generator 162 is demonstrated in the example of FIG. 4 as being tuned by an externally provided resistor $R_R$. As an example, the externally provided resistor $R_R$ can be coupled to the IC package (e.g., via a pin) by a respective customer to set a transconductance of the associated transconductance amplifier to tune the slope of the ramp signal $V_R$.

The switching controller 150 further includes a comparator 164 that is configured to compare the ramp signal $V_R$ and the voltage $V_{T2}$. In the example of FIG. 4, the comparator 164 receives the ramp signal $V_R$ at a non-inverting input and receives the voltage $V_{T2}$ at an inverting input. Therefore, in response to the voltage $V_R$ increasing to an amplitude that is approximately equal to (e.g., just greater than) the voltage $V_{T2}$, such as at approximately the time $T_4$ in the example of FIG. 3, the comparator 164 can provide a second comparison signal CMP2 that is provided to a reset input of an SR latch 166. The SR latch 166 is configured to generate the signal $PWM_2$ at a Q output. Therefore, the SR latch 166 can de-assert the signal $PWM_2$ in response to the second comparison signal CMP2. The SR latch 166 also receives a delayed inverted version of the signal $PWM_1$ at the set input, as provided from the Q' output of the SR latch 154 and provided via a buffer 168. For example, the buffer 168 can provide a requisite dead-time delay for delaying assertion of the signal $PWM_2$ in response to de-assertion of the signal $PWM_1$.

Figure 5:
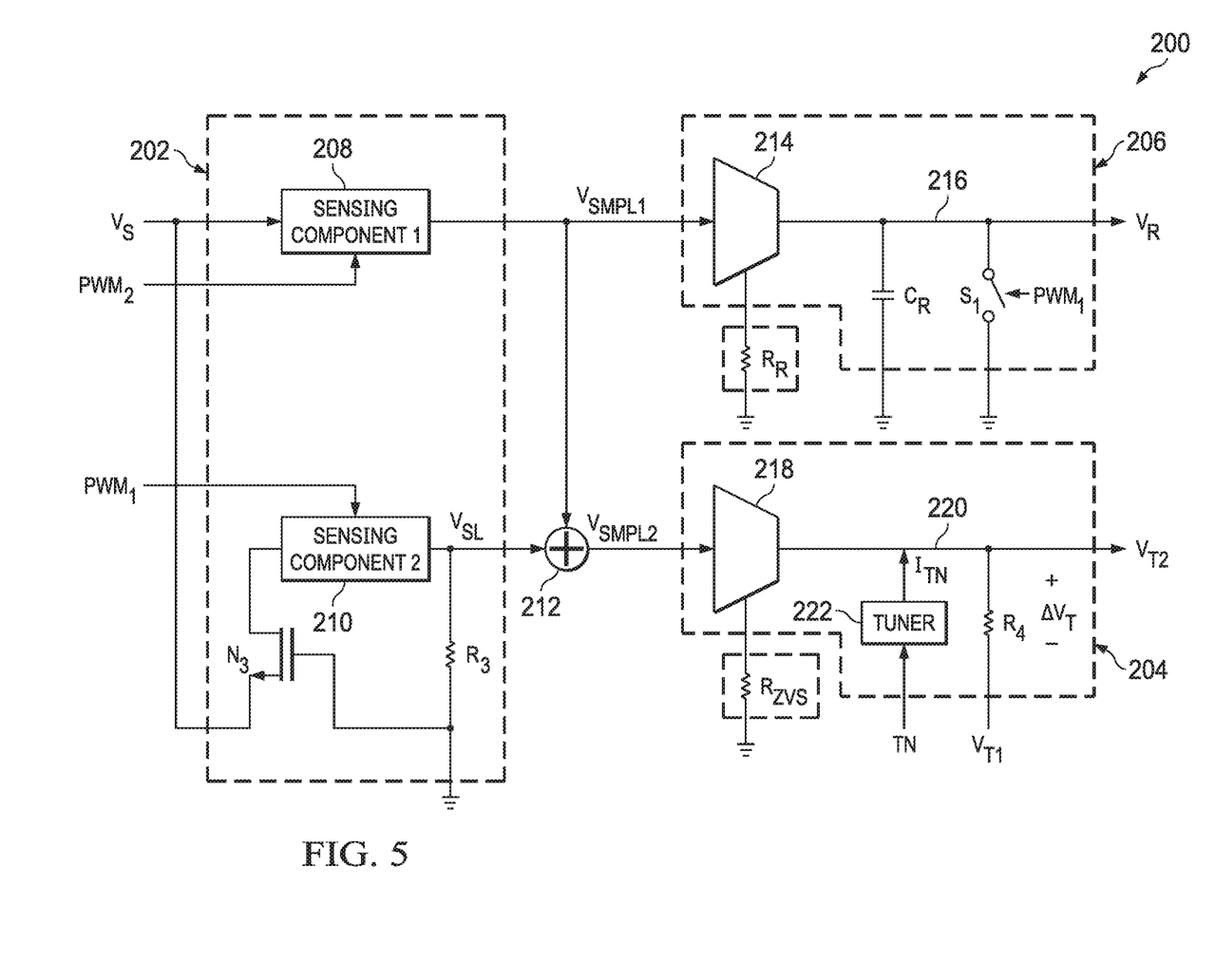
FIG. 5 illustrates another example of a switching controller.

FIG. 5 illustrates an example of a switching controller 200. The switching controller 200 can correspond to a portion of the switching controller 150 in the example of FIG. 4. Particularly, the switching controller 200 demonstrates a $V_S$ sampler circuit 202, a ZVS optimizer 204, and a ramp generator 206 that can correspond to the $V_S$ sampler circuit 158, the ZVS optimizer 160, and the ramp generator 162, respectively, in the example of FIG. 3. Therefore, reference is to be made to the example of FIGS. 2-4 in the following description of the example of FIG. 5.

The $V_S$ sampler circuit 202 includes a first sensing component 208 and a second sensing component 210 that are configured to sample the voltage $V_S$. In the example of FIG. 5, the first sensing component 208 is configured to sample the voltage $V_S$ in response to assertion of the signal $PWM_2$ to provide a first sample voltage $V_{SMPL1}$. As an example, the first sample voltage $V_{SMPL1}$ can be expressed as:

$$V_{SMPL1} = K_1 * (N_P/N_S) * V_{OUT} \quad \text{Equation 3}$$

Where: $K_1$ is a constant corresponding to the sampling of the voltage $V_S$, expressed as:

$$K_1 = (N_A/N_P) * R_2/(R_1 + R_2) \quad \text{Equation 4}$$

Where: $N_A/N_P$ is a turns ratio between the auxiliary winding $N_A$ and the primary winding $N_P$.

Similarly, the second sensing component 210 is configured to sample the voltage $V_S$ in response to assertion of the signal $PWM_1$ to provide a second sample voltage $V_{SMPL2}$. The voltage $V_S$, at the time of sampling via the signal $PWM_1$, has a negative amplitude, and thus is provided to the second sensing component 210 via an N-FET $N_3$ having a drain coupled to the second sensing component 210, a source coupled to the voltage $V_S$, and a gate coupled to a low-voltage rail (e.g., ground). The second sensing component 210 is configured to generate a voltage $V_{SL}$ that is added to the first sample voltage $V_{SMPL1}$ via a summer 212 to generate the second sample voltage $V_{SMPL2}$. In the example of FIG. 5, the gate of the N-FET $N_3$ is coupled to the low-voltage rail, and the voltage $V_{SL}$ is separated from the low-voltage rail via a resistor $R_3$. As an example, the resistor $R_3$ can be expressed as:

$$R_3 = (R_1 * R_2)/(R_1 + R_2) \quad \text{Equation 5}$$

Thus, the second sample voltage $V_{SMPL2}$ can be expressed as:

$$V_{SMPL2} = K_1 * (V_{IN} + (N_P/N_S) * V_{OUT}) \quad \text{Equation 6}$$

The first sample voltage $V_{SMPL1}$ is provided to the ramp generator 206, and is particularly provided as an input to a transconductance amplifier 214 that is configured to generate the ramp signal $V_R$ at an output node 216. The ramp generator 206 includes a capacitor $C_R$ and a switch $S_1$ that are arranged in parallel between the output node 216. The switch $S_1$ is controlled by the signal $PWM_1$. Additionally, in the example of FIG. 5, the transconductance amplifier 214 includes a resistor $R_R$ that is provided externally (e.g., via an IC package pin) to set the gain of the transconductance amplifier 214. As an example, the resistor $R_R$ can have a resistance value expressed as follows:

$$R_R = K_1 * K_R * L_M/(R_S * C_R) \quad \text{Equation 7}$$

Where: $K_R$ is a gain constant of the transconductance amplifier 214, such that the gain of the transconductance amplifier 214 is defined as $(K_R/R_R)$.

Therefore, in response to the first sample voltage $V_{SMPL1}$, the transconductance amplifier 214 can provide a current based on the external resistor $R_R$, which can charge the capacitor $C_R$ while the switch $S_1$ is open based on the signal $PWM_1$ being de-asserted.

As a result, the ramp generator 206 generates the ramp signal $V_R$ having a linear slope that is proportional to the decay rate of the magnetizing current $I_M$ based on the first sample voltage $V_{SMPL1}$. As an example, the slope ramp signal $S_R$ corresponding to the ramp voltage $V_R$ can be expressed as follows:

$$S_R = K_1 * (N_P/N_S) * V_{OUT} * K_R/(R_R * C_R) = (N_P/N_S) * V_{OUT} * R_S/L_M \quad \text{Equation 8}$$

Thus, the ramp signal $V_R$ can be generated to be substantially free of noise and drift that can result in errors in the de-assertion of the signal $PWM_2$, and thus the zero-volt switching of the N-FET $Q_1$.

In response to the ramp signal $V_R$ having an amplitude that is approximately equal to the voltage $V_{T2}$, such as at approximately the time $T_4$ in the example of FIG. 3, the switching controller 150 is configured to de-assert the signal $PWM_2$ (e.g., via the comparator 164 and the SR latch 166 in the example of FIG. 4), and to thus subsequently assert the signal $PWM_1$ (e.g., via the ZVS discriminator 156, as described in greater detail herein). Upon assertion of the signal $PWM_1$, the switch $S_1$ closes to couple the output node 216 to the low-voltage rail (e.g., ground), and to thus reset the ramp signal $V_R$. Upon de-assertion of the signal $PWM_1$, the switch $S_1$ can open again, and thus the transconductance amplifier 214 can begin to generate the ramp signal $V_R$ again, as described previously.

The second sample voltage $V_{SMPL2}$ is provided to the ZVS optimizer 204, and is particularly provided an input to a transconductance amplifier 218 that is configured to generate the voltage $V_{T2}$ at an output node 220. The ZVS optimizer 204 also includes a tuner circuit 222 and a resistor $R_4$ that are coupled to the output node 220. In the example of FIG. 5, the transconductance amplifier 218 includes a resistor $R_{ZVS}$ that is provided externally (e.g., via an IC package pin) to set the gain of the transconductance amplifier 218. As an example, the resistor $R_{ZVS}$ can have a resistance value defined as:

$$R_{ZVS} = K_1 * K_{ZVS} * R_4 \Big/ \left( R_S * K_O * \sqrt{\frac{C_{SW}}{L_M}} \right) \quad \text{Equation 9}$$

Where: $K_{ZVX}$ is a gain constant of the transconductance amplifier 218, such that the gain of the transconductance amplifier 214 is defined as $(K_{ZVS}/R_{ZVX})$.

The tuner circuit 222 is configured to receive the tuning signal TN, and can generate a tuning current $I_{TN}$ that is provided to the output node 220. As an example, the tuning circuit 222 can be configured as a switchable network of current mirrors that are configured to provide incremental portions of the tuning current $I_{TN}$ that can increase the amplitude of the voltage $V_{T2}$. Additionally, the resistor $R_4$ separates the voltage $V_{T1}$ from the output node 220, and thus has a difference voltage $\Delta V_T$ across the resistor $R_4$. Accordingly, the voltage $V_{T2}$ can be expressed as a sum of the voltage $V_{T1}$ and the difference voltage $\Delta V_T$. The difference voltage $\Delta V_T$ is generated by a current sum of a feedforward current signal and a tuning current $I_{TN}$ flowing though a resistor $R_4$. The feedforward signal comprises a transconductance amplifier 218 having a transconductance constant that is set via an external resistor $R_{ZVS}$ to set the feedforward gain for the amplifier input, which is the sampled auxiliary voltage $V_{SMPL2}$. The external resistor configures the feedforward gain based on a predetermined power stage parameter, which can be expressed as $C_{SW}/L_M$.

The difference voltage $\Delta V_T$ can be additionally tuned (as described in greater detail herein) based on the tuning current $I_{TN}$ to further increase or decrease the amplitude of the voltage $V_{T2}$. The voltage $V_{T2}$ can thus be generated based on the amplitude of the magnetizing current $I_M$ sufficient to provide the zero-volt switching, as provided in Equation 2. As an example, the voltage $V_{T2}$ can be expressed as follows:

$$V_{T2} = V_{T1} + \left[ \left( R_S * K_O * \sqrt{\frac{C_{SW}}{L_M}} \right) * (V_{IN} + (N_P/N_S) * V_{OUT}) + I_{TN} \right] * R_4 \quad \text{Equation 10}$$

Equation 10 thus demonstrates that the voltage $V_{T2}$ is generated as a result of the input voltage $V_{IN}$, the output voltage $V_{OUT}$, the predetermined parameter ($C_{SW}/L_M$) of the power stage, and a tuning signal $I_{TN}$ 54. Accordingly, ZVS optimizer 204 can generate the voltage $V_{T2}$ in a manner that provides dynamic zero-volt switching of the N-FET $Q_1$ in response to changes in the input voltage $V_{IN}$, the output voltage $V_{OUT}$ based on the feed forward signal, and correct any error from the feedforward gain setting by a tuning signal $I_{TN}$.

Figure 6:
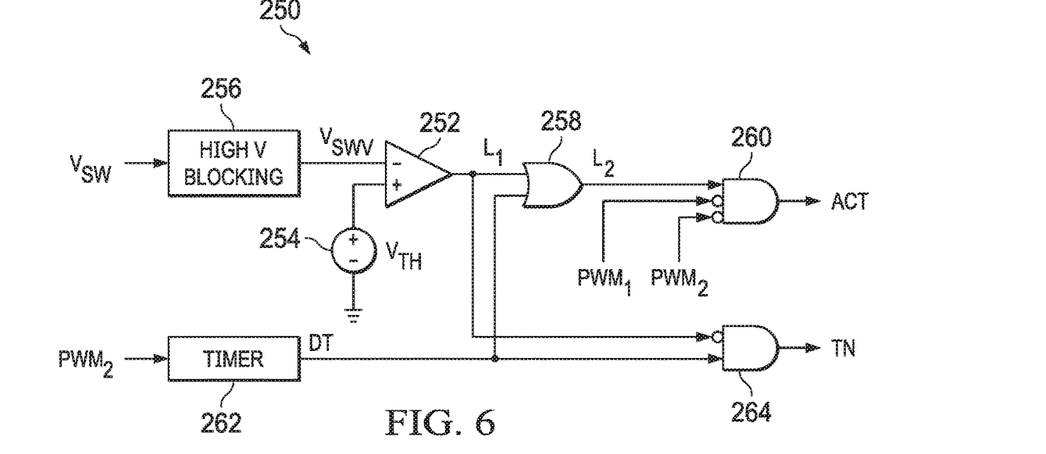
FIG. 6 illustrates an example of a zero-voltage switching (ZVS) discriminator.

FIG. 6 illustrates an example of a zero-voltage switching (ZVS) discriminator 250. The ZVS discriminator 250 can correspond to the ZVS discriminator 156 in the example of FIG. 4. Therefore, reference is to be made to the examples of FIGS. 2-4 in the following description of the example of FIG. 6.

The ZVS discriminator 250 includes a comparator 252 that is configured to compare the switching voltage $V_{SW}$ and the threshold voltage $V_{TH}$. In the example of FIG. 6, the comparator 252 receives the threshold voltage $V_{TH}$, demonstrated as being generated via a voltage source 254, at a non-inverting input, and a voltage $V_{SWV}$ at an inverting input. The voltage $V_{SWV}$ corresponds to the switching voltage $V_{SW}$ having been provided via a high voltage blocking circuit ("HIGH V BLOCKING") 256. As an example, the high voltage blocking circuit 256 is configured to block the switching voltage $V_{SW}$ at an amplitude that is greater than a predetermined threshold. For example, the high voltage blocking circuit 256 can be configured in a variety of ways, such as including an arrangement of diode(s), a JFET, an LDMOS transistor, or a variety of other ways to block amplitudes of the switching voltage above a predetermined threshold (e.g., approximately five volts).

Figure 7:
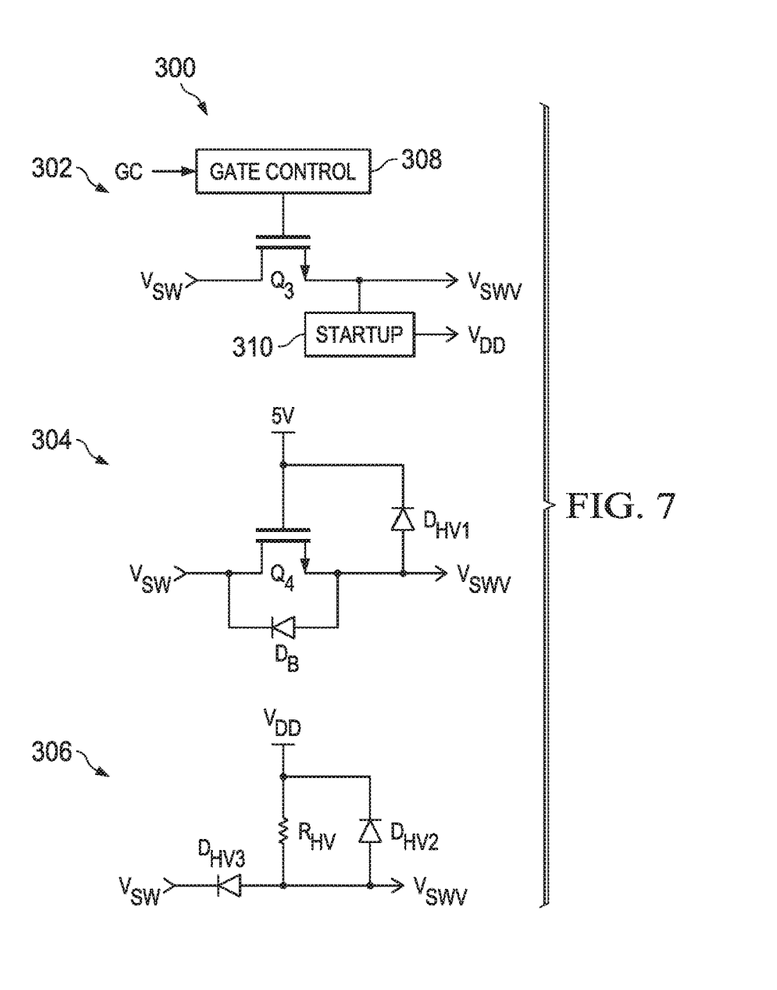
FIG. 7 illustrates examples of high-voltage blocking circuits.

FIG. 7 illustrates a diagram 300 of separate examples of high-voltage blocking circuits. The diagram 300 demonstrates three separate examples of high-voltage blocking systems, demonstrated at 302, 304, and 306, respectively, that could each be configured as the high voltage blocking circuit 256 in the example of FIG. 6. Therefore, reference is to be made to the example of the example of FIG. 6 in the following discussion of the example of FIG. 7.

The first example of a high-voltage blocking circuit 302 includes a gate control circuit 308 that controls a gate of a JFET $Q_3$ via a gate control signal GC. As an example, the JFET $Q_3$ can be configured as a high-voltage N-channel JFET. The JFET $Q_3$ has a drain that is coupled to the switching voltage $V_{SW}$ and a source that provides the voltage $V_{SWV}$. Therefore, the gate control circuit 308 can be configured to control an activation state of the JFET $Q_3$ to substantially block a high-voltage amplitude of the voltage $V_{SW}$. For example, the gate control circuit 308 can be configured to hold the gate voltage of the JFET $Q_3$ to a relatively high voltage based on the gate control signal GC for high-voltage start up of the power converter circuit 50, and can subsequently decrease the gate voltage of the JFET $Q_3$ based on the gate control signal GC for sensing the switching voltage $V_{SW}$ and protecting the ZVS discriminator 250 from high-voltage amplitudes of the switching voltage $V_{SW}$.

The second example of a high-voltage blocking circuit 304 includes an LDMOS $Q_4$ that has a gate coupled to a 5V voltage source (e.g., from a low-dropout voltage source). The LDMOS $Q_4$ has a drain that is coupled to the switching voltage $V_{SW}$ and a source that provides the voltage $V_{SWV}$. Additionally, the source of the LDMOS $Q_4$ is coupled to an anode of a diode $D_{HV1}$, with the diode $D_{HV1}$ having a cathode that is coupled to the 5V voltage source. Additionally, the LDMOS $Q_4$ includes a body-diode $D_B$ that interconnects the source and the drain of the LDMOS $Q_4$. Thus, the LDMOS $Q_4$ acts as a diode interconnecting the switching voltage $V_{SW}$ and the inverting input of the comparator 252. Accordingly, the LDMOS $Q_4$ can provide high-voltage blocking of the switching voltage $V_{SW}$.

The third example of a high-voltage blocking circuit 306 includes a resistor $R_{HV}$ interconnecting a high-voltage power rail (e.g., the voltage VDD) and the inverting input of the comparator 252 on which the voltage $V_{SWV}$ is provided. An anode of a diode $D_{HV2}$ is likewise coupled to the inverting input of the comparator 252 on which the voltage $V_{SWV}$ is provided, with the diode $D_{HV2}$ having a cathode that is coupled to the high-voltage rail. Additionally, the third example of a high-voltage blocking circuit 306 includes a diode $D_{HV3}$ that interconnects the inverting input of the comparator 252 on which the voltage $V_{SWV}$ is provided at an anode and the switching voltage $V_{SW}$ at a cathode. Thus, the third example of a high-voltage blocking circuit 306 is arranged similar to the second example of the high-voltage blocking circuit 304, except that it substitutes the LDMOS $Q_4$ with the diode $D_{HV3}$. Accordingly, the diode $D_{HV3}$ can provide high-voltage blocking of the switching voltage $V_{SW}$.

Referring back to the example of FIG. 6, in response to the switching voltage $V_{SW}$ decreasing less than the threshold voltage $V_{TH}$ (e.g., less than one volt), then the comparator 252 is configured to assert an output signal $L_1$ that is provided as an input to a logic OR gate 258. The logic OR gate 258 can thus assert a signal output $L_2$ that is provided as an input to a logic AND gate 260. The logic AND gate 260 also receives the signal $PWM_1$ and the signal $PWM_2$ at inverted inputs, such that the logic AND gate 260 is configured to assert the activation signal ACT in response to the switching voltage $V_{SW}$ decreasing less than the threshold voltage $V_{TH}$, via the output signal $L_2$, while the signals $PWM_1$ and $PWM_2$ are logic-low. As demonstrated in the example of FIG. 4, the activation signal ACT is provided to the SR latch 154 to assert the signal $PWM_1$.

In addition, in the example of FIG. 6, the ZVS discriminator 250 also includes a timer 262. The timer 262 is configured to implement a timer count sequence in response to a falling-edge of the signal $PWM_2$. As an example, the timing associated with the zero-volt switching of the N-FET $Q_1$ may not be correct, in that it is possible that the N-FET $Q_1$ is commanded to activate too soon (e.g., at initialization of the power converter circuit 50), such as prior to the magnetizing current $I_M$ flowing negative for sufficient time to discharge the capacitance of the switching node 58. Thus, in response to de-assertion of the signal $PWM_2$, the presence of capacitive charge on the switching node 58 can be such that the switching voltage $V_{SW}$ does not decrease to approximately zero volts, but could instead decrease to a non-zero positive amplitude that is greater than the threshold voltage $V_{TH}$. As a result, in that example, the comparator 252 would not assert the output signal $L_1$, likewise resulting in the activation signal ACT never being activated.

Therefore, the timer 262 is configured to monitor the time-elapsed since de-assertion of the signal $PWM_2$, and to assert a dead-time signal DT in response to the timer value being equal to a predetermined dead-time that indicates that the switching voltage $V_{SW}$ did not decrease less than the threshold voltage $V_{TH}$. The dead-time signal DT can thus be provided to the logic OR gate 258 to assert the output signal $L_2$, and thus to ensure that the activation signal ACT is asserted to subsequently assert the signal $PWM_1$.

In addition, the dead-time signal DT is provided to a logic AND gate 264 along with an inverted version of the output signal $L_1$. In response to the dead-time signal DT being asserted the logic AND gate 264 can assert the tuning signal TN. The tuning signal TN is provided to the tuner circuit 222 in the example of FIG. 5. As a result, in response to the tuning signal TN being provided to the tuner circuit 222, the tuner circuit 222 can be configured to provide a current increment to the output node 220 of the ZVS optimizer 204 to increase the voltage $V_{T2}$. For example, the tuner circuit 222 can be configured as a shift register that is configured to selectively activate one or more current mirrors that each provide a predetermined current increment, such that each time the tuning signal TN is provided to the tuner circuit 222, an additional current mirror can be activated to provide a respective additional current increment to the output node 220 of the ZVS optimizer 204.

As a result of the increase of the voltage $V_{T2}$, the ramp signal $V_R$ linearly increases for a longer duration of time. Because the slope of ramp signal $V_R$ is proportional to the decay rate of magnetizing current $I_M$, the magnetizing current $I_M$ thus flows in the negative direction for a longer duration of time to discharge more of the capacitive charge from the switching node 58. As a result, in response to de-assertion of the signal $PWM_2$, the switching voltage $V_{SW}$ can decrease to a lesser amplitude based on the decrease in the capacitive charge stored in the switching node 58. The ZVS discriminator 250 can therefore provide the tuning signal TN to iteratively tune the voltage $V_{T2}$ to set the voltage $V_{T2}$ to eventually correspond to the sufficient duration, and thus sufficient negative amplitude, of the magnetizing current $I_M$ that provides for zero-volt switching of the N-FET $Q_1$.

On the other hand, when the switching voltage reaches the threshold voltage $V_{TH}$ before the dead-time signal DT time elapsed, the tuning signal TN cannot be asserted. Therefore, the tuner circuit 222 can be configured to provide a current decrement to the output node 220 of the ZVS optimizer 204 to reduce the voltage V. For example, the tuner circuit 222 can be configured as a shift register that is configured to selectively deactivate one or more current mirrors that each provide a predetermined current decrement, such that when the tuning signal TN for a switching cycle is not provided to the tuner circuit 222, a reduced number of mirrored currents can provide a respective current decrement to the output node 220 of the ZVS optimizer 204.

As a result of the decreasing of the voltage $V_{T2}$, the ramp signal $V_R$ linearly decreases for a shorter duration of time. Because the slope of ramp signal $V_R$ is proportional to the decay rate of magnetizing current $I_M$, the magnetizing current $I_M$ thus flows in the negative direction for a shorter duration of time to discharge less of the capacitive charge from the switching node 58. As a result, in response to de-assertion of the signal $PWM_2$, the switching voltage $V_{SW}$ can reach the threshold voltage $V_{TH}$ closer to the dead-time signal DT elapsed time. As a result, the negative magnetizing current $I_M$ does not decrease unnecessarily larger than the amplitude necessary that is sufficient for the switching voltage $V_{SW}$ to be approximately equal to the threshold voltage $V_{TH}$ during a given elapsed time of the dead-time signal DT.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A power converter circuit comprising:
   a power stage comprising a transformer and a switch, the switch being controlled in response to a pulse-width modulation (PWM) signal to provide a primary current through a primary winding of the transformer to induce a secondary current in a secondary winding of the transformer to generate an output voltage, the power stage comprising a switching node between the switch and the primary winding having a switching voltage; and a switching controller configured to generate the PWM signal in response to a ramp signal, the ramp signal having a slope that is proportional to a decay rate of a magnetizing current associated with the transformer and generated in response to at least one feedback voltage from the power stage, the switch being activated in response to the switching voltage having an amplitude of approximately zero volts based on the amplitude of the ramp signal.

2. The circuit of claim 1, wherein the transformer further comprises an auxiliary winding that is configured to generate an auxiliary voltage, wherein the switching controller comprises a sampling circuit configured to sample the auxiliary voltage, the ramp signal being generated based on the sampled auxiliary voltage.

3. The circuit of claim 2, wherein the switching controller comprises a ramp generator configured to generate the ramp signal, the ramp generator comprising a transconductance amplifier having a transconductance constant that is set via an external resistor and is configured to generate the ramp signal based on the sampled auxiliary voltage.

4. The circuit of claim 2, wherein the switching controller comprises a zero-voltage switching (ZVS) optimizer circuit configured to set a ramp threshold having an amplitude that is associated with the amplitude of the ramp signal that corresponds to a negative peak amplitude of the magnetizing current to set the switching voltage to approximately zero volts, such that the switching controller is configured to control the PWM signal to thereby activate the switch in response to the ramp signal increasing to approximately the amplitude of the ramp threshold.

5. The circuit of claim 1, wherein the PWM signal is a first PWM signal, and wherein the switch is a first switch, wherein the power stage further comprises an LC resonator formed by the primary winding and a capacitor and a second switch that is alternately activated via a second PWM signal to circulate the magnetizing current via the LC resonator,
wherein the switching controller comprises a zero-voltage switching (ZVS) optimizer circuit configured to set a ramp threshold having an amplitude that is associated with an amplitude of the ramp signal that corresponds to a negative peak amplitude of the magnetizing current to decrease capacitive charge at the switching node,
wherein the switching controller is configured to deactivate the second switch via the second PWM signal in response to the ramp signal increasing to approximate the ramp threshold, and wherein the switching controller is configured to activate the first switch via the first PWM signal in response to the switching voltage decreasing to less than an activation threshold voltage to activate the first switch in response to the switching voltage having an amplitude of approximately zero volts.

6. The circuit of claim 5, wherein the ZVS optimizer circuit comprises a transconductance amplifier having a transconductance constant that is set via an external resistor and is configured to generate the ramp threshold as a difference voltage that is added to a switching threshold having an amplitude that is based on a predetermined power stage parameter corresponding to a ratio of switching node capacitance and magnetizing inductance.

7. The circuit of claim 6, wherein the transformer further comprises an auxiliary winding that is configured to generate an auxiliary voltage, wherein the switching controller comprises a sampling circuit configured to sample the auxiliary voltage based on the second PWM signal to generate the ramp signal, and to sample the auxiliary voltage based on the first PWM signal to generate the ramp threshold.

8. The circuit of claim 5, further comprising a ZVS discriminator circuit that is configured to generate an activation signal in response to comparing the switching voltage with the activation threshold voltage, and is further configured to monitor an on-time associated with the second PWM signal via a timer, wherein the ZVS optimizer circuit is further configured to tune the amplitude of the ramp threshold in response to the timer counting to a predetermined time duration.

9. The circuit of claim 8, wherein the ZVS discriminator circuit comprises a high-voltage blocking circuit configured to block an amplitude of the switching voltage that is greater than a predetermined threshold, wherein the high-voltage blocking circuit comprises one of a JFET, an LDMOS device, and a diode interconnecting the switching voltage and an input of a comparator that is configured to compare the switching voltage with the activation threshold voltage.

10. An integrated circuit (IC) chip comprising at least a portion of the power converter circuit of claim 1.

11. A power converter circuit comprising:
a power stage comprising a transformer, a first switch, and a second switch, the first switch being controlled via a first pulse-width modulation (PWM) signal to provide a primary current through a primary winding of the transformer to induce a secondary current in a secondary winding of the transformer to generate an output voltage, and the second switch being controlled via a second PWM signal to re-circulate a magnetizing current associated with the transformer via an LC resonator formed by the primary winding and a capacitor; and
a switching controller configured to generate the first PWM signal and the second PWM signal and to generate a ramp signal in response to feedback from the power stage such that a slope of the ramp signal is proportional to a decay rate of the magnetizing current to provide zero-volt switching (ZVS) activation of the first switch via the first PWM signal.

12. The circuit of claim 11, wherein the switching controller comprises a ZVS optimizer circuit configured to set a ramp threshold that has an amplitude that is associated with an amplitude of the ramp signal, which corresponds to a negative peak amplitude of the magnetizing current to decrease capacitive charge at a switching node associated with the first switch,
wherein the switching controller is configured to deactivate the second switch via the second PWM signal in response to the ramp signal increasing to approximately equal to the ramp threshold, and
wherein the switching controller is configured to activate the first switch via the first PWM signal in response to the switching voltage decreasing to less than an activation threshold voltage to provide the ZVS activation of the first switch.

13. The circuit of claim 12, wherein the ZVS optimizer circuit comprises a transconductance amplifier having a transconductance constant that is set via an external resistor and is configured to generate the ramp threshold as a difference voltage that is added to a switching threshold having an amplitude that is based on a predetermined output voltage threshold.

14. The circuit of claim 13, further comprising a ZVS discriminator circuit that is configured to generate an activation signal in response to comparing the switching voltage with the activation threshold voltage, and is further configured to monitor an on-time associated with the second PWM signal via a timer, wherein the ZVS optimizer circuit is further configured to tune the amplitude of the difference voltage in response to the timer counting to a predetermined time duration.

15. The circuit of claim 12, wherein the transformer further comprises an auxiliary winding that is configured to generate an auxiliary voltage, wherein the switching controller comprises a sampling circuit configured to sample the auxiliary voltage via the second PWM signal to generate the ramp signal and to sample the auxiliary voltage via the first PWM signal to generate the ramp threshold.

16. An integrated circuit (IC) chip comprising a power converter circuit, the power converter circuit comprising:
  a gate driver stage configured to generate a first switching signal in response to a first pulse-width modulation (PWM) signal and a second switching signal in response to a second PWM signal;
  a power stage comprising a transformer, a first switch, and a second switch, the first switch being controlled via the first switching signal to provide a primary current through a primary winding of the transformer to induce a secondary current in a secondary winding of the transformer to generate an output voltage and induce an auxiliary voltage in an auxiliary winding of the transformer, and the second switch being controlled via the second switching signal to re-circulate a magnetizing current associated with the transformer via an LC resonator formed by the primary winding and a capacitor; and
  a switching controller configured to generate the first and second PWM signals and to generate a ramp signal based on the auxiliary voltage, the ramp signal having a slope that is proportional to a decay rate of the magnetizing current to provide zero-volt switching (ZVS) activation of the first switch via the first PWM signal.

17. The circuit of claim 16, wherein the switching controller comprises a ZVS optimizer circuit configured to set a ramp threshold that has an amplitude that is approximately associated with an amplitude of the ramp signal that corresponds to a negative peak amplitude of the magnetizing current to decrease capacitive charge at a switching node associated with the first switch, wherein the switching controller is configured to deactivate the second switch via the second PWM signal in response to the ramp signal increasing to approximately equal to the ramp threshold, and wherein the switching controller is configured to activate the first switch via the first PWM signal in response to a switching voltage at the switching node decreasing to less than an activation threshold voltage to activate the first switch in response to the switching voltage having an amplitude of approximately zero volts.

18. The circuit of claim 17, wherein the ZVS optimizer circuit comprises a transconductance amplifier having a transconductance constant that is set via an external resistor and is configured to generate the ramp threshold as a difference voltage that is added to a switching threshold having an amplitude that is based on a predetermined output voltage threshold.

19. The circuit of claim 18, further comprising a ZVS discriminator circuit that is configured to generate an activation signal in response to comparing the switching voltage with the activation threshold voltage, and is further configured to monitor an on-time associated with the second PWM signal via a timer, wherein the ZVS optimizer circuit is further configured to tune the amplitude of the difference voltage in response to the timer counting to a predetermined time duration.

20. The circuit of claim 17, wherein the switching controller comprises a sampling circuit configured to sample the auxiliary voltage from the auxiliary winding in response to the second PWM signal to generate the ramp signal and to sample the auxiliary voltage via the first PWM signal to generate the ramp threshold.

* * * * *